United States Patent [19]

Kurganov et al.

[11] 4,378,083
[45] Mar. 29, 1983

[54] WIRING MACHINE WIRE PLACING HEAD

[76] Inventors: Vladimir Y. Kurganov, 3 proezd Stroitelei, 4, kv. 43; Alexandr I. Kuryshev, ulitsa Vavilova, 32, kv. 1, both of Saratov, U.S.S.R.

[21] Appl. No.: 265,389

[22] Filed: May 20, 1981

[51] Int. Cl.³ .............................................. B65H 17/36
[52] U.S. Cl. .................................... 226/158; 226/162
[58] Field of Search ............... 29/850; 140/112; 93 R; 226/134, 136, 137, 141, 158, 160, 162, 187

[56] References Cited

U.S. PATENT DOCUMENTS 3,331,545  7/1967  Olivieri ............................. 226/187
3,338,492  8/1967  Cornell, Jr. ...................... 226/187 X

FOREIGN PATENT DOCUMENTS 589100  1/1978  U.S.S.R. ............................ 226/162

Primary Examiner—Stuart S. Levy
Assistant Examiner—Dao Huynh
Attorney, Agent, or Firm—Murray Schaffer

[57] ABSTRACT

A wiring machine wire placing head comprises a housing with wire guides, a wire gripper unit, a wire feed mechanism, and a wire break pickup. The wire feed mechanism is constructed as two electromagnetic drives connected to a source of controllable voltage. One of the electromagnetic drives is mechanically connected with the wire gripper unit which is constructed as two jaws installed with a clearance therebetween and spring-loaded against each other. One of the jaws is rigidly secured to a pivoted lever mounted in the housing and the other jaw is connected to the armature of one of the electromagnetic drives. The wire break pickup is constructed as a set of contacts arranged to be operated by an abutment provided on the pivoted lever.

7 Claims, 4 Drawing Figures

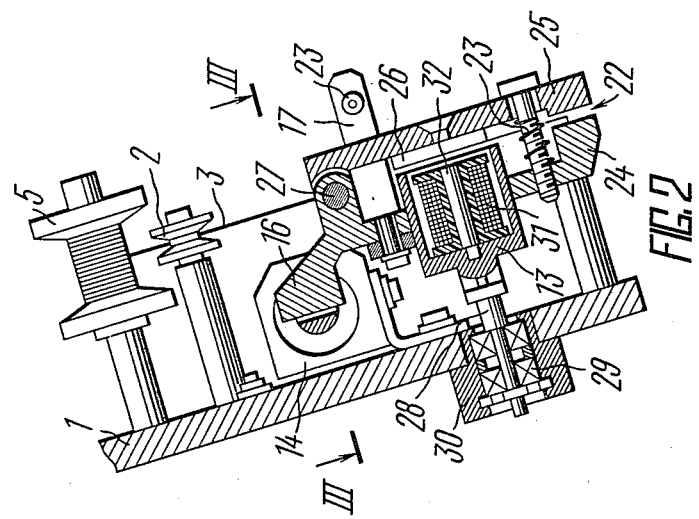
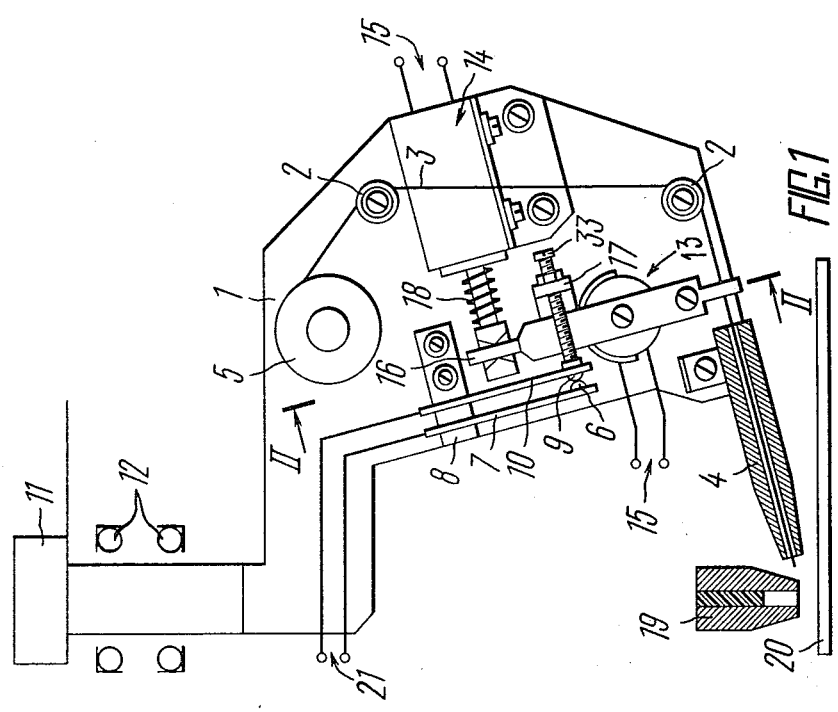

WIRING MACHINE WIRE PLACING HEAD

TECHNICAL FIELD

The invention relates to electronics and radio engineering and has particular reference to wiring machine wire placing heads. It may be used in wiring apparatus, more specifically, in automatic board wiring machines.

BACKGROUND ART

Known in the art is a wire placing device (USSR Inventor's Certificate No. 589100 dated 1978) comprising a feed pulley and a hold-down roller mounted in a spring-loaded case. The pulley and the roller are driven from a drive shaft through gear pairs. The driving gear of the hold-down roller is constructed in the form of a hollow housing with an internal tooth rim. The other gears and the spring-loaded case are situated inside the housing, the spring-loaded case being rotatable about the drive shaft. This device has a complicated construction and lacks high accuracy of positioning the wire at the point of connection to the board. Another disadvantage is that this device does not provide for tensioning the wire in placing same and for monitoring wire breakage during the wiring process.

Also known in the art is a wire placing device (USSR)Inventor's Certificate No. 604640, dated 1978) comprising wire guides mounted in a housing, a wire gripper unit mounted before one of the wire guides, and a wire feed mechanism made up of gears forming at the point of their mesh a saddle-shaped groove mechanically interacting with the wire being placed and a wire placer unit. This device suffers from the disadvantage that it does not provide for giving controlled tension to the wire being placed and for monitoring wire breakage. Another disadvantage is that the device lacks high accuracy of positioning the wire at the point of connection to the board and does not provide against damage to the wire surface resulting from single-point contact between the hold-down element and the wire. A still another disadvantage of this device is that it cannot be used to feed wire of very small diameter.

DISCLOSURE OF THE INVENTION

It is an object of the present invention to provide a wiring mechine wire placing head which will make it possible to prevent damage to the surface of wire during placement thereof.

It is another object of the invention to provide a wiring machine wire placing head which will make it possible to enhance accuracy of wire positioning.

It is still another object of the invention to provide a wiring machine wire placing head which will make it possible to give controlled wire tension and monitor wire breakage.

According to the invention, there is provided a wiring machine wire placing head comprising a housing, wire guides mounted on the housing, a wire gripper unit situated before one of the wire guides, and a wire feed mechanism mechanically connected with the wire gripper unit. The wire placing head is provided with a wire break pickup mounted on the housing. The wire feed mechanism is constructed as two mechanically coupled electromagnetic drives connected to a source of controllable voltage, one of the electromagnetic drives, which is mechanically connected with the wire gripper unit, being mounted on a pivoted lever which is pivotally mounted in the housing and provided with an abutment arranged to operate the wire break pickup. The wire gripper unit is constructed as two jaws installed with a clearance therebetween and spring-loaded against each other, one of the jaws being rigidly secured to the pivoted lever, whereas the other jaw is connected to the armature of that electromagnetic drive and movably mounted on the pivoted lever.

It is desirable that the wire guides should be installed along the axis passing through the centre of the clearance between the jaws.

It is further desirable that the wire break pickup should be constructed as a set of contacts, wherein one contact is rigidly secured to the housing, whereas another contact is mounted on the housing by means of an elastic strip.

It is still further desirable that the abutment of the pivoted lever should be provided with an adjusting screw.

The wire placing head of the present invention is capable of placing wire without damaging its surface and gives controlled tension of wire in placing same, variation of wire tension from the preset value not exceeding 5 percent. This wire placing head also ensures positioning the wire end at the point of connection to the wiring board to an accuracy of 0.1 mm.

BRIEF DESCRIPTION OF THE DRAWINGS

The invention will now be explained in further detail by describing an embodiment thereof with reference to the accompanying drawings, wherein:

FIG. 1 is a general view of a wiring machine wire placing head according to the invention;

FIG. 2 is a sectional view on the line II—II of FIG. 1 according to the invention;

DETAILED DESCRIPTION OF THE INVENTION

Figure 3:
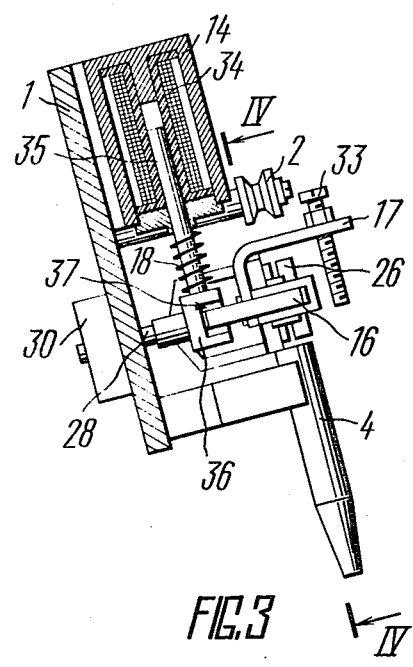
FIG. 3 is a sectional view on the line III—III of FIG. 2 according to the invention.

The wiring machine wire placing head comprises a housing 1 (FIG. 1), wire guides 2 constructed as freely rotating pulleys, and a wire guide 4 constructed as a capillary tube. The wire guides 2 and 4 are mounted on the housing 1. Wire 3 is carried on a reel 5.

The wire placing head further comprises a wire gripper unit situated before the wire guide 4, and a wire feed mechanism mechanically connected with the wire gripper unit.

The wire placing head is provided with a wire break pickup constructed, for example, as a set of contacts, wherein a contact 6 is rigidly secured by means of a strip 7 to a bracket 8 mounted on the housing 1, whereas a contact 9 is attached to the bracket 8 by means of an elastic strip 10.

For rotation of the head, provision is made of a drive 11 and of rolling-contact bearings 12.

The wire feed mechanism is constructed as two mechanically coupled electromagnetic drives 13 and 14 connected to a source 15 of controllable voltage. The electromagnetic drive 13 is mounted on a pivoted lever 16 which is pivotally mounted in the housing 1 and provided with an abutment 17 arranged to operate the wire break pickup constructed as a set of contacts. This drive 13 is connected to the wire gripper unit. The drive 14 is provided with a return spring 18.

The wire 3 is fed to underneath electrodes 19 located over a wiring board 20. The set of contacts is connected to the terminals of an alarm panel 21.

The wire gripper unit is constructed as two jaws 24 and 25 (FIG. 2) installed with a clearance 22 therebetween and loaded by a spring 23 against each other. The jaw 24 is rigidly secured to the pivoted lever 16. The jaw 25 is connected to the armature 26 of the electromagnetic drive 13 and movably mounted on the pivoted lever 16 by means of a shaft 27.

The electromagnetic drive 13 is attached to the pivoted lever 16 which is mounted on a shaft 28 installed in a bearing unit including rolling-contact bearings 29 and a bushing 30 rigidly connected to the housing 1.

The electromagnetic drive 13 comprises a coil 31 (FIG. 3) with a winding, and a core 32.

In this embodiment of the invention, the abutment 17 is provided with an adjusting screw 33.

The electromagnet 14 includes a coil 34 with a winding, and an armature 35. One end of the armature 35 has a projection 36 with a slot 37 which receives the pivoted lever 16.

Figure 4:
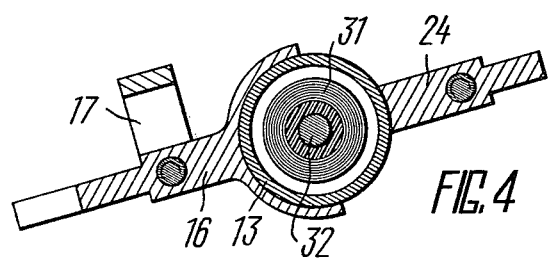
FIG. 4 is a sectional view on the line IV—IV of FIG. 3 according to the invention.

FIG. 4 shows a sectional view on the line IV—IV of FIG. 3 taken through the connection between the pivoted lever 16 and the electromagnetic drive 13.

Before commencing the operation of connecting the wire 3 (FIG. 1) to the wiring board 20 by means of the electrodes 19, electric current is supplied from the controllable voltage source 15 to the coil 31 (FIG. 2) of the electromagnetic drive 13, owing to which the armature 26 is pulled to the core 32 and, acting against the effort of the return spring 23, shifts the movable jaw 25, whereby the wire 3 is gripped between the jaws 24 and 25. By varying the voltage of the power source 15 (FIG. 1), the gripping force on the wire 3 can be adjusted so that no damage is caused to the wire surface, whereas the wire 3, when under a breaking tension, does not slip between the jaws 24 and 25 (FIG. 2).

Then electric current is supplied from the controllable voltage source 15 (FIG. 1) to the coil 34 (FIG. 3) of the electromagnetic drive 14, which, by pulling the armature 35 into the coil 34 and acting against the effort of the return spring 18, turns the pivoted lever 16 on the shaft 28, the lever 16 carrying therewith the electromagnetic drive 13 (FIG. 2) and the gripper unit together with the wire 3 gripped between the jaws 24 and 25. The wire 3 unreels from the reel 5 (FIG. 1), passes over the guides 2 and 4, and is fed into the connection area by an amount controllable by the use of the adjusting screw 33 (FIG. 3) provided on the abutment 17.

This constructional arrangement of the wire gripper unit and its interconnection with the electromagnetic drives provide for keeping the wire surface intact and positioning the wire 3 with high accuracy at the connection point on the wiring board 20.

After the wire 3 (FIG. 1) is connected to the wiring board 20 by means of the electrodes 19, the coil 34 (FIG. 3) of the electromagnetic drive 14 is cut off from the controllable voltage source 15 (FIG. 1), whereas the voltage applied to the coil 31 (FIG. 2) of the electromagnetic drive 13 is reduced to the value required to create the preset gripping force on the wire 3 so that the latter can be pulled between the closed jaws 24 and 25. When the wiring board 20 (FIG. 1) is moved in the plane perpendicular to the axis of head rotation, the head turns in the bearings 12 by the action of the drive 11, tracing the direction of wire placement, whereas the wire 3, by virtue of friction in passing between the jaws 24 and 25, is given controlled tension which varies with the voltage applied to the coil 31 of the electromagnetic drive 13.

In this case the abutment 17 with its adjusting screw 33 stays clear of the set of contacts, and the contacts 6 (FIG. 1) and 9 remain open.

In the event of wire breakage or failure to be connected to the board 20, the pivoted lever 16 is returned by the spring 18 into the initial position. The abutment 17 with the adjusting screw 33 closes the contacts 6 and 9 by moving the contact 9 mounted on the elastic strip 10, and the signal from these contacts goes to the terminals of the alarm panel 21. The rigidly secured contact 6 locates the initial position of the gripper unit, which also enhances the accuracy of positioning the wire at the connection point in the wiring board.

The proposed invention provides for giving the wire 3 controlled tension, monitoring wire breakage during the wiring process, and carrying out highly accurate wiring, using wire of various diameters, including microfine wire.

What is claimed is:

1. A wiring machine wire placing head comprising a housing;
    a wire break pickup mounted on said housing;
    an abutment;
    a pivoted lever pivotally mounted in said housing and provided with said abutment;
    said abutment arranged to operate said wire break pickup;
    wire guides mounted on said housing;
    a controllable voltage source;
    a wire feed mechanism constructed as two mechanically coupled electromagnetic drives connected to said controllable voltage source;
    an armature of the first electromagnetic drive of said two electromagnetic drives;
    the first electromagnetic drive of said two electromagnetic drives, mounted on said pivoted lever;
    a wire gripper unit constructed as two jaws installed with a clearance therebetween and spring-loaded against each other;
    the first jaw of said two jaws, rigidly secured to said pivoted lever;
    the second jaw of said two jaws, connected to said armature of said first electromagnetic drive of said two electromagnetic drives and movably mounted on said pivoted lever;
    said wire gripper unit situated before one wire guide of said wire guides and connected to the first electromagnetic drive of said two electromagnetic drives.

2. A head as claimed in claim 1, comprising said wire guides installed along the axis passing through the centre of said clearance between said jaws.

3. A head as claimed in claim 2, comprising said wire break pickup constructed as a set of contacts;
    the first and second contacts of said set of contacts;
    an elastic strip;
    said first contact rigidly secured to said housing;
    said second contact mounted on said housing by means of said elastic strip.

4. A head as claimed in claim 2, comprising an adjusting screw provided on said abutment of said pivoted lever.

5. A head as claimed in claim 1, comprising said wire break pickup constructed as a set of contacts;
    the first and second contacts of said set of contacts;

an elastic strip;
said first contact rigidly secured to said housing;
said second contact mounted on said housing by means of said elastic strip.

6. A head as claimed in claim 5, comprising an adjusting screw provided on said abutment of said pivoted lever.

7. A head as claimed in claim 1, comprising an adjusting screw provided on said abutment of said pivoted lever.

* * * * *